United States Patent
Narwankar et al.

(10) Patent No.: US 6,548,368 B1
(45) Date of Patent: Apr. 15, 2003

(54) METHOD OF FORMING A MIS CAPACITOR

(75) Inventors: Pravin Narwankar, Sunnyvale, CA (US); Ravi Rajagopalan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/644,941

(22) Filed: Aug. 23, 2000

(51) Int. Cl.$^7$ ............................................. H01L 21/20
(52) U.S. Cl. ................. 438/398; 438/381; 438/387; 438/240; 438/513; 438/680; 438/769; 257/296; 257/303; 257/306; 257/310; 257/639; 257/640
(58) Field of Search ................. 438/381–398, 438/96–97, 482, 513, 680, 769, 786–787, 238–240, 244; 257/296–313, 538, 639–640

(56) References Cited

U.S. PATENT DOCUMENTS

| | | | | |
|---|---|---|---|---|
| 4,914,497 A | * | 4/1990 | Kondo | 357/51 |
| 5,998,264 A | * | 12/1999 | Wu | 438/260 |
| 6,146,939 A | * | 11/2000 | Dasgupta | 438/251 |
| 6,303,481 B2 | * | 12/2000 | Park | 438/591 |
| 6,190,992 B1 | * | 2/2001 | Sandhu et al. | 438/398 |
| 6,194,264 B1 | * | 2/2001 | Ping et al. | 438/255 |
| 6,204,203 B1 | * | 3/2001 | Narwankar et al. | 438/785 |
| 6,251,720 B1 | * | 6/2001 | Thakur et al. | 438/240 |
| 6,265,327 B1 | * | 7/2001 | Kobayashi et al. | 438/776 |
| 6,300,253 B1 | * | 10/2001 | Moore et al. | 438/763 |
| 6,300,671 B1 | * | 10/2001 | Moore et al. | 257/639 |
| 6,326,301 B1 | * | 12/2001 | Venkatesan et al. | 438/638 |
| 2001/0011740 A1 | * | 8/2001 | Deboer et al. | 257/306 |

FOREIGN PATENT DOCUMENTS

JP 64-35946 * 2/1989 ............ H01L/27/04

OTHER PUBLICATIONS

Fazan et al. "Ultrathin oxide/nitride dielectrics for rugged stacked dram capacitors" IEEE Electron device letters vol. 13 No. 2 Feb. 1992 pp. 86–88.*

Lo et al. "Highly reliable, high–c dram storage capacitors with cvd TA205 films on rugged polysilicon" IEEE Electron device letters vol. 14 No. 5 May 1993 pp. 216–218.*

Fazan et al. "A high–c capacitor with ultrathin cvd Ta205 films deposited on rugged poly–si for high density drams" 0–7803–0817–Apr. 1992 IEDM/IEEE 1992 pp. 263–266.*

* cited by examiner

Primary Examiner—Matthew Smith
Assistant Examiner—Granvill D Lee, Jr.
(74) Attorney, Agent, or Firm—Townsend and Townsend and Crew

(57) ABSTRACT

Provided is a method of integrating $Ta_2O_5$ into an MIS stack capacitor for a semiconductor device by forming a thin SiON layer at the Si/TaO interface using low temperature remote plasma oxidation anneal. Also provided is a method of forming an MIS stack capacitor with improved electrical performance by treating $SiO_2$ with remote plasma nitridation or SiN layer with rapid thermal oxidation or RPO to form a SiON layer prior to $Ta_2O_5$ deposition with TAT-DMAE, TAETO or any other Ta-containing precursor.

13 Claims, 11 Drawing Sheets

METHOD OF FORMING A MIS CAPACITOR

BACKGROUND OF THE INVENTION

1. Field of the Invention

The present invention relates generally to the field of semiconductor manufacturing. More specifically, the present invention relates to a method of integrating tantalum pentaoxide into an MIS stack capacitor using low thermal budget.

2. Description of the Related Art

Integrated circuits are made up of literally millions of active and passive devices such as transistors, capacitors and resistors. A dynamic random access memory (DRAM) capacitor generally includes a stack capacitor and a trench capacitor. The stack capacitor includes a fin structure, a cylinder structure, and a box structure. The cylinder structure is generally used taking the capacitance into consideration.

In order to provide more computational power and/or more storage capability, DRAM capacitors are scaled down and made more and more compact with shrinking device geometry (see FIG. 1). A more compact DRAM capacitor requires higher capacitance. For example, memory structures with bit density of 4G or higher have capacitor area of $0.25 \times 0.25$ $\mu m^2$ or smaller and require capacitance/area storage elements higher than 300 fF/$\mu m^2$. For high capacitance, it is suggested that a contact area of a storage node electrode and a plate electrode be made large in a limited cell area and that the dielectric film be formed of a material having a high dielectric ratio (see FIG. 2).

High dielectric constant films are generally ceramic films (i.e., metal-oxides) such as tantalum pentaoxide. Tantalum pentaoxide ($Ta_2O_5$) is a desired capacitor dielectric material due to its high dielectric constant of about 25. In contrast, other commonly utilized dielectric materials have much lower dielectric constants. For instance, silicon nitride has a dielectric constant of about 8 and silicon dioxide has a dielectric constant of about 4. Due to the high dielectric constant of $Ta_2O_5$, a thinner layer of $Ta_2O_5$ can be utilized in capacitor constructions to achieve the same capacitance as thicker layers of other materials.

Semiconductive capacitors comprise a first conductive plate and a second conductive plate, with a dielectric layer formed between the plates. Commonly, the conductive plates comprise doped polysilicon, with one or both of the plates comprising a rugged form of polysilicon, such as, for example, hemispherical grain polysilicon (HSG). When dielectric films are deposited, they tend to have vacancies at the anionic (oxygen) sites in the lattice. Presently these vacancies are filled by annealing the film in an oxygen containing gas. However, this annealing causes oxidation of the underlying polysilicon electrode, which causes the formation of a silicon dioxide film in series with the high dielectric constant film which in turn reduces the effective dielectric constant of the combined film.

When utilizing $Ta_2O_5$ as the dielectric layer in DRAM capacitors, the chemical vapor deposition (CVD) processes by which $Ta_2O_5$ is formed adversely complicate its incorporation into semiconductive capacitors. For instance, $Ta_2O_5$ is not typically deposited onto a first polysilicon plate, nor is a second polysilicon plate typically directly deposited onto $Ta_2O_5$. The underlying and overlying polysilicon layers are affected adversely by the $Ta_2O_5$-forming CVD processes unless such polysilicon layers are first protected with barrier layers. Presently, $Ta_2O_5$ is typically formed by a CVD process in which $Ta(OC_2H_5)_5$(TAETO) and oxygen are combined. Unless a polysilicon plate is protected by a barrier layer before such CVD deposition over the polysilicon, the oxygen of the CVD process will react with the polysilicon to disadvantageously form a layer of silicon dioxide over the polysilicon.

Currently available methods for protecting the polysilicon include provision of a silicon nitride layer over the polysilicon prior to deposition of $Ta_2O_5$. The silicon nitride layer is typically 10 to 25 angstroms thick. However, $Ta_2O_5$ integration as deposited (see FIG. 3) is deficient in oxygen and forms a very leaky film as shown in FIG. 4. That is, it has a large leakage current. Since oxidation anneal of the film is essential to make $Ta_2O_5$ a useful dielectric material for highly integrated device, proper thermal oxidation annealing condition is important for $Ta_2O_5$ integration. FIG. 5 shows that oxidation in a stronger oxidizing environment improves J–V characteristics, but the capacitance goes down significantly (i.e., $T_{ox}$ increases). Therefore, proper oxidation is needed to make $Ta_2O_5$ a useful dielectric, which provides high capacitance and low leakage current at the same time.

High temperature oxidation is commonly used, wherein the oxidization step employed comprises a rapid thermal oxidation (RTO) process which is typically carried out at a temperature of from about 700 to about 1150° C., or comprises rapid thermal annealing (RTA) using the $N_2O$ gas, which is carried out at a temperature of 800° C. $Ta_2O_5$ as integrated provides good electrical performance (i.e., low leakage current); however, the capacitance might not be efficiently high.

Therefore, the prior art is deficient in the lack of effective means of integrating $Ta_2O_5$ into an MIS capacitor, particularly to provide both high capacitance and low leakage current. The present invention fulfills this long-standing need and desire in the art.

SUMMARY OF THE INVENTION

In one embodiment, there is provided a method of forming an MIS capacitor, comprising the step of forming a silicon oxynitride layer at the interface of a silicon surface of a substrate and a dielectric film. This method could further comprise a step of annealing the dielectric film.

In another embodiment, there is provided a method of integrating $Ta_2O_5$ into an MIS stack capacitor for a semiconductor device, comprising the step of forming a thin barrier layer at the Si/TaO interface.

Various tantalum-containing precursors are used for depositing tantalum pentaoxide. The present data shows that proper sequencing of the deposition process leads to similar results with either TAETO or TAT-DMAE. Therefore, a method is hereby provided to form an MIS stack capacitor, comprising the steps of: forming a silicon nitride film on a silicon surface of a substrate; treating the silicon nitride film with rapid thermal oxidation to form a silicon oxynitride film, wherein the silicon nitride film is eliminated; and depositing tantalum pentaoxide above the silicon oxynitride film with a Ta-containing precursor.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION $Ta_2O_5$ high K dielectric is used for high density DRAM devices. The current generation of these devices include MOS, MIS or MIM stack capacitors, or trench capacitors. Shown in FIG. 3 is an MIS capacitor cell with a $Ta_2O_5$ dielectric layer. The bottom electrode is polysilicon, specifically, hemispherical grain polysilicon (HSG). As shown in FIG. 3C, $Ta_2O_5$ integration leads to several critical interfaces which become more important as the film thins down. The present invention focuses on the interface of $TaO_x/Si_3N_4$. Using the currently available methods, the electrical performance of a $Ta_2O_5$ stack capacitor is poor because $Ta_2O_5$ as deposited using state-of-art techniques is deficient in oxygen and forms a very leaky film (see FIG. 4). The methods and processes of the present invention remedy this problem of the prior art techniques.

Oxidation anneal of the film under proper thermal conditions is essential to make $Ta_2O_5$ a useful dielectric material for highly integrated devices. As shown in FIG. 5, oxidation in a stronger oxidizing environment improves electrical performance. However, the capacitance goes down significantly (i.e., $T_{ox}$ increases) due to a thicker SiO layer forming at the SiN/TaO interface.

The forming of the interlayer is confirmed by both medium energy ion scattering (MEIS) and TEM data. Medium energy ion scattering analysis shows a Si diffusion which indicates possible SiON interlayer as deposited (FIG. 6A) or after high temperature $N_2O$ anneal (FIG. 6B), and TEM data suggests that an additional layer exists between $Ta_2O$, and SiN after $N_2O$ anneal at 800° C. (FIG. 7). Therefore, an interlayer is formed at the SiN/TaO interface under high temperature anneal. However, such an interlayer formed under the high thermal budget in the state-of-art processes is so thick that the capacitance of the $Ta_2O_5$ capacitor decreases significantly.

Methods are hereby provided to control the Si/TaO interface so that an MIS capacitor can be formed with a high capacitance and low current leakage.

In one aspect, there is provided a method of forming an MIS capacitor by forming a silicon oxynitride (SiON) film at the interface of a silicon surface of a substrate and a dielectric film. Specifically, the SiON film is formed by the steps of performing oxidation in a rapid thermal processor at a temperature of lower than 700° C. to obtain a uniform silicon dioxide ($SiO_2$) film; and doping the $Si_2$ film with N-containing gas mixtures at a temperature of not higher than 700° C. to form the SiON film, so that the $SiO_2$ film is eliminated.

Various rapid thermal processes may be used for oxidation, such as a rapid thermal process using oxygen, a rapid thermal process using nitrous oxide, in situ steam generation (ISSG) or remote plasma oxidation (RPO). The resulting $SiO_2$ film has a thickness of less than about 10 angstroms. For nitridation, the $SiO_2$ film is doped with N-containing gas mixtures in a remote plasma hardware for about 3 minutes at a temperature of from about 650° C. to about 700° C.; or for about 5 minutes at a temperature of about 650° C. or lower. The resulting SiON film has a thickness of less than about 10 angstroms. Examples of N-containing gas mixtures include $N_2$, $N_2$ with Argon, $N_2$ with Helium, $NH_3$, $NH_3$ with Argon and $NH_3$ with Helium.

The above method of forming an MIS capacitor may further comprise the step of annealing the dielectric film. Specifically, the annealing is performed in a remote plasma hardware for less than 3 minutes at a temperature of about 700° C., or for less than 5 minutes at a temperature of about 600° C. or lower.

Alternatively, to form an MIS capacitor, the SiON film is formed by the steps of forming a silicon nitride (SiN) film on a silicon surface of a substrate; and then treating the SiN film with rapid thermal oxidation to form a SiON film, wherein the SiN film is eliminated.

Figure 1:
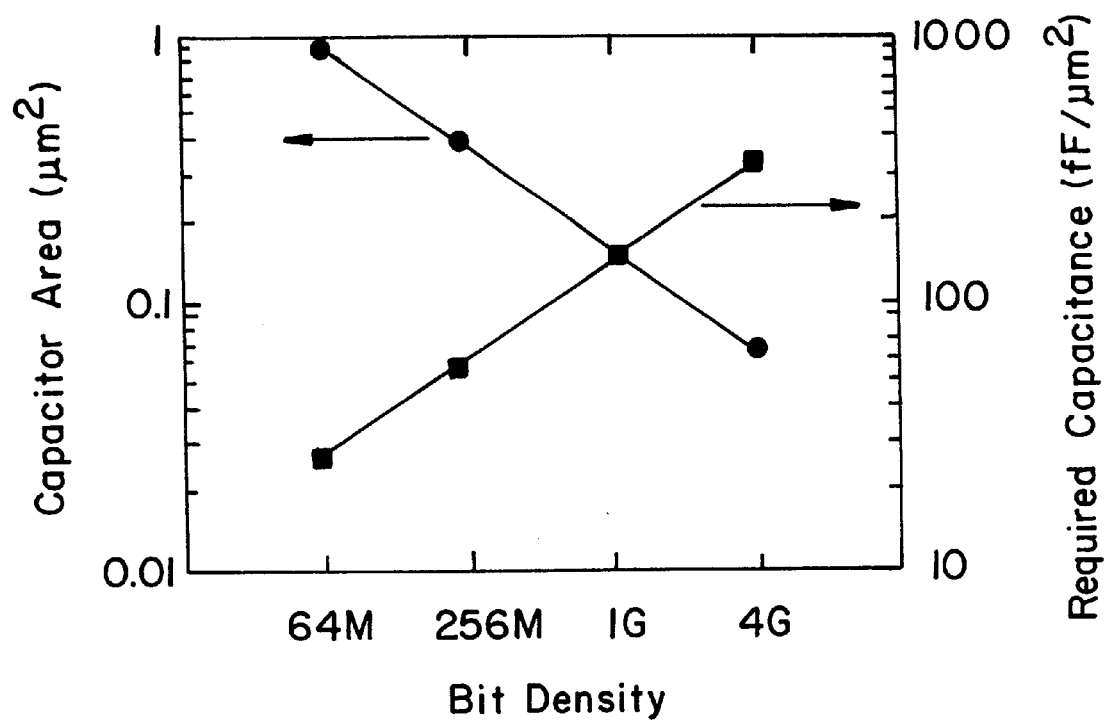
FIG. 1 shows dynamic random access memory (DRAM) capacitor trend, wherein memory structures having bit density of 64M, 256M, 1G or 4G are listed.
Figure 2:
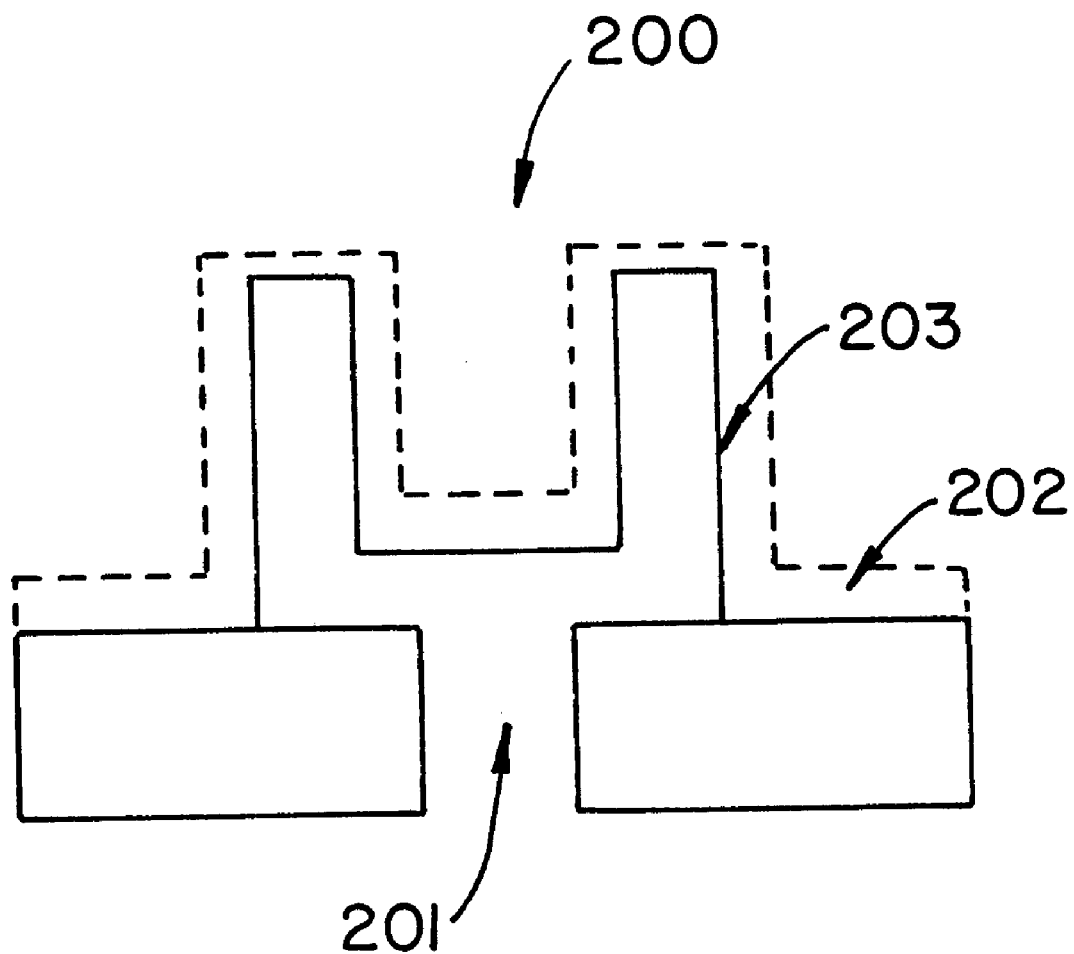
FIG. 2 illustrates a cross-section view of a DRAM capacitor 200 including a bottom storage node electrode 201, a top plate electrode 202 and a dielectric film 203 formed between the bottom and top electrodes.
Figure 3A:
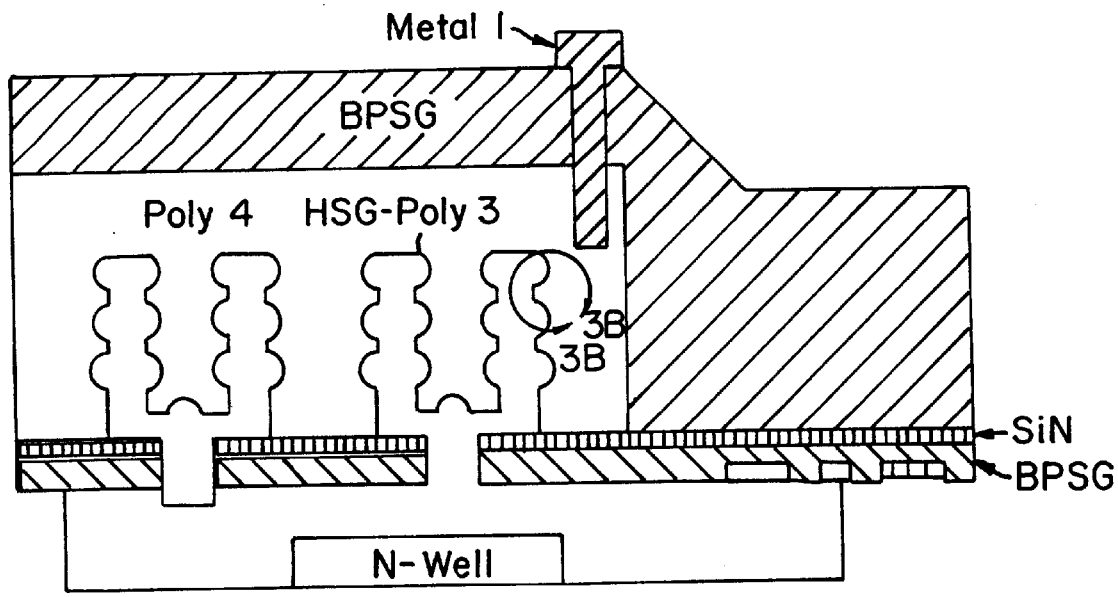
FIG. 3A is a cross-section view of an MIS capacitor including metal 1, insulating layer of glass (boron/phosphorus-doped silicon oxide, i.e., BPSG) and silicon nitride.
Figure 3B:
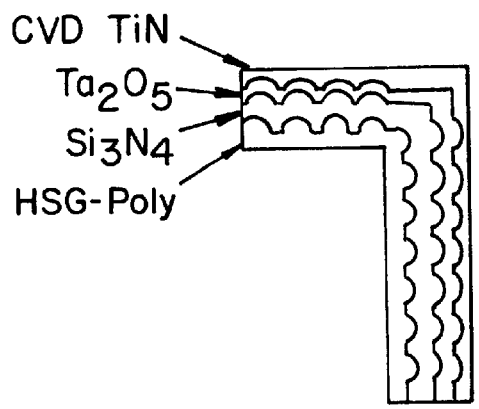
FIG. 3B is an enlarged view of the circled area in FIG. 3A demonstrating the $Ta_2O_5$ integration. The top plate electrode is titanium nitride (TiN) formed by chemical vapor deposition processes. The bottom electrode is hemispherical grain polysilicon (HSG). Tantalum pentaoxide ($Ta_2O_5$) is deposited on a silicon nitride layer ($Si_3N_4$) between the top and bottom electrodes.
Figure 3C:
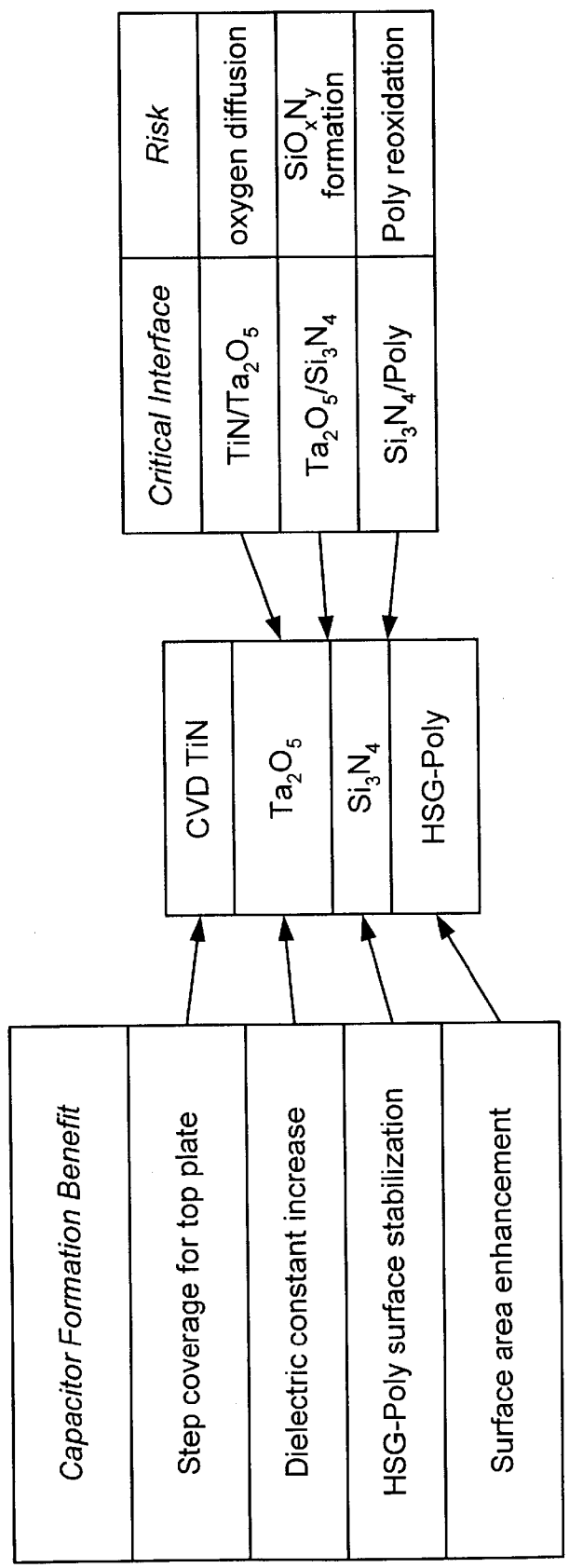
FIG. 3C lists the multiple layers and interfaces caused by $Ta_2O_5$ integration.
Figure 4:
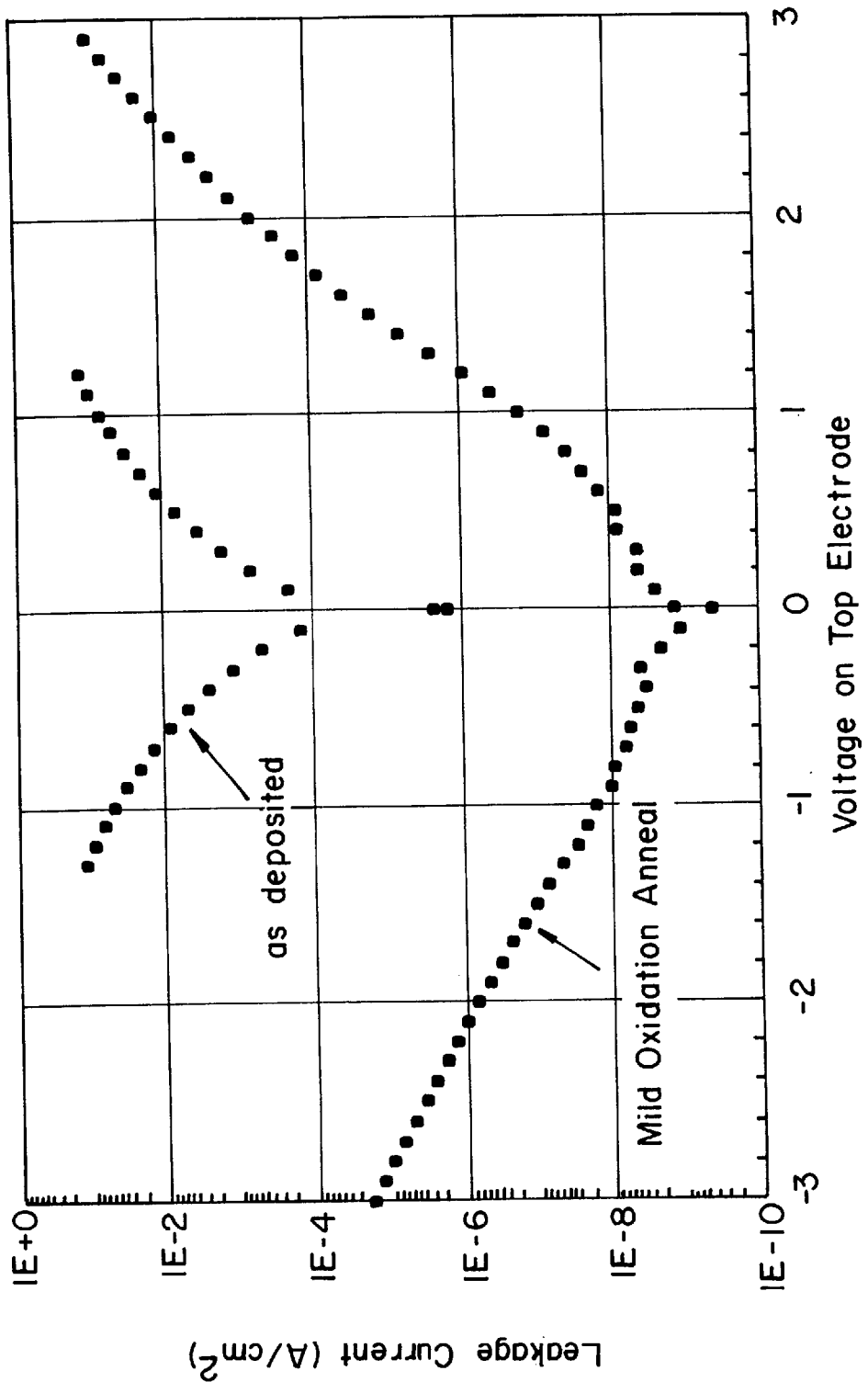
FIG. 4 shows the J (leakage current, $A/cm^2$)–V (applied voltage on top electrode, Volt) characteristics of $Ta_2O_5$ film.
Figure 5:
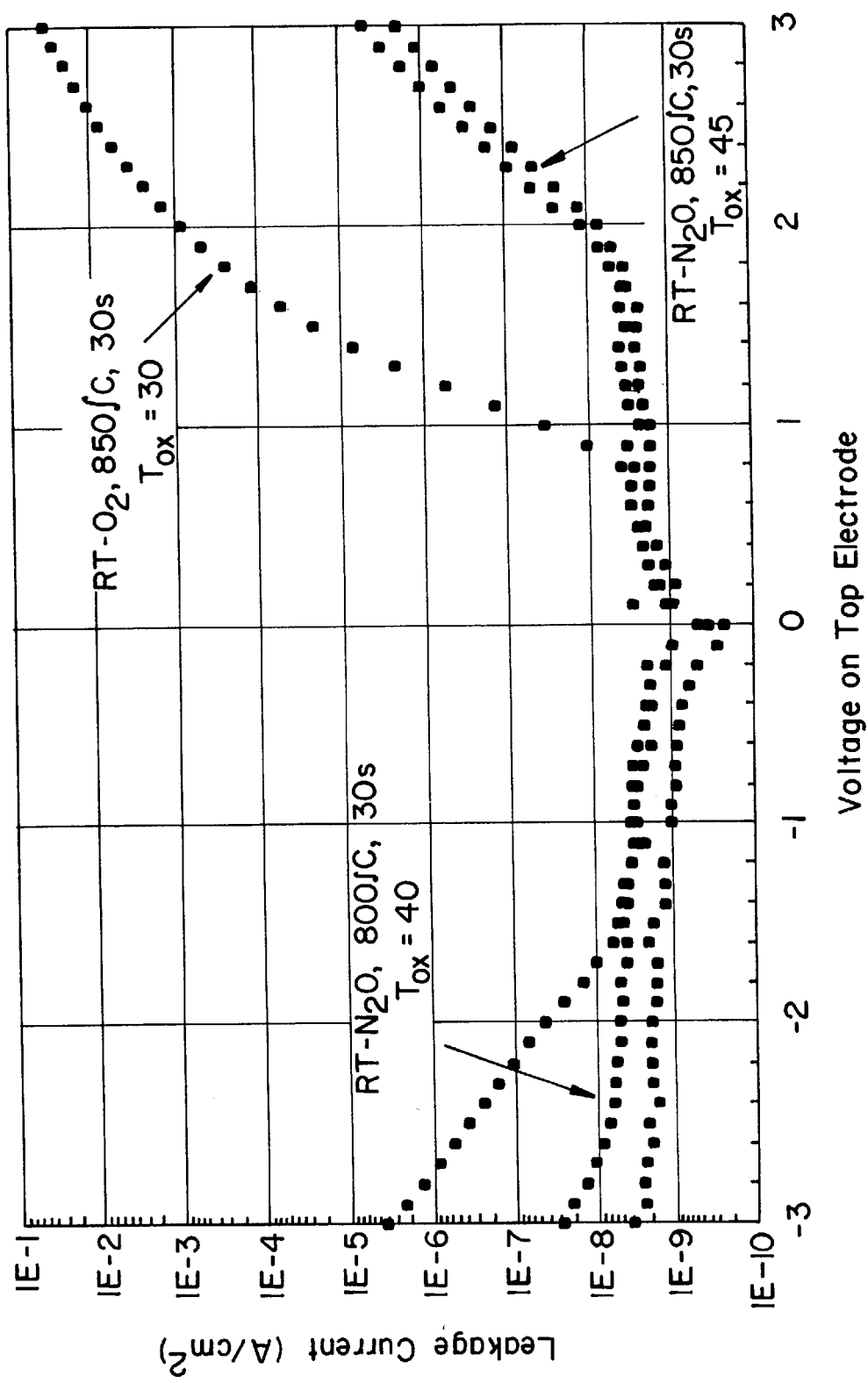
FIG. 5 shows comparison of J–V characteristics of $Ta_2O_5$ under different thermal oxidation anneal conditions, wherein rapid thermal oxidation (RTO) used is $RT-O_2$ or $RT-N_2O$, and the temperature used is either 800° C. or 850° C.
Figure 6A:
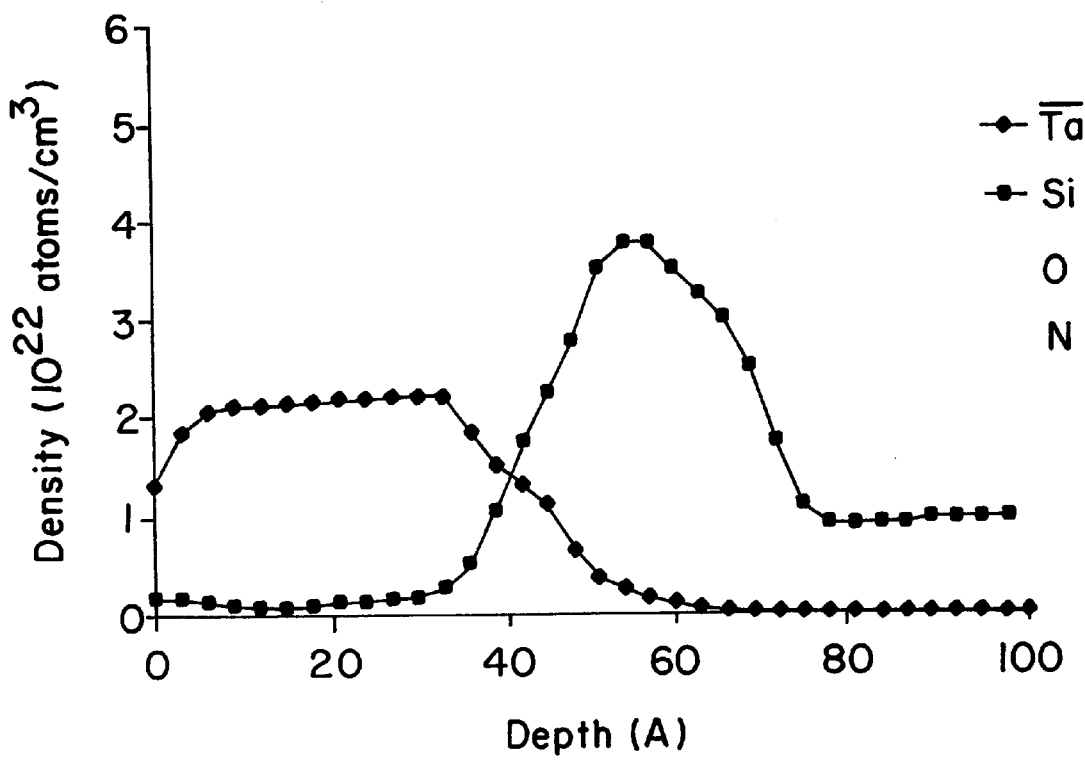
FIG. 6A shows medium energy ion scattering (MEIS) for as deposited demonstrating that $Ta_2O_5$/SiN interface is well defined.
Figure 6B:
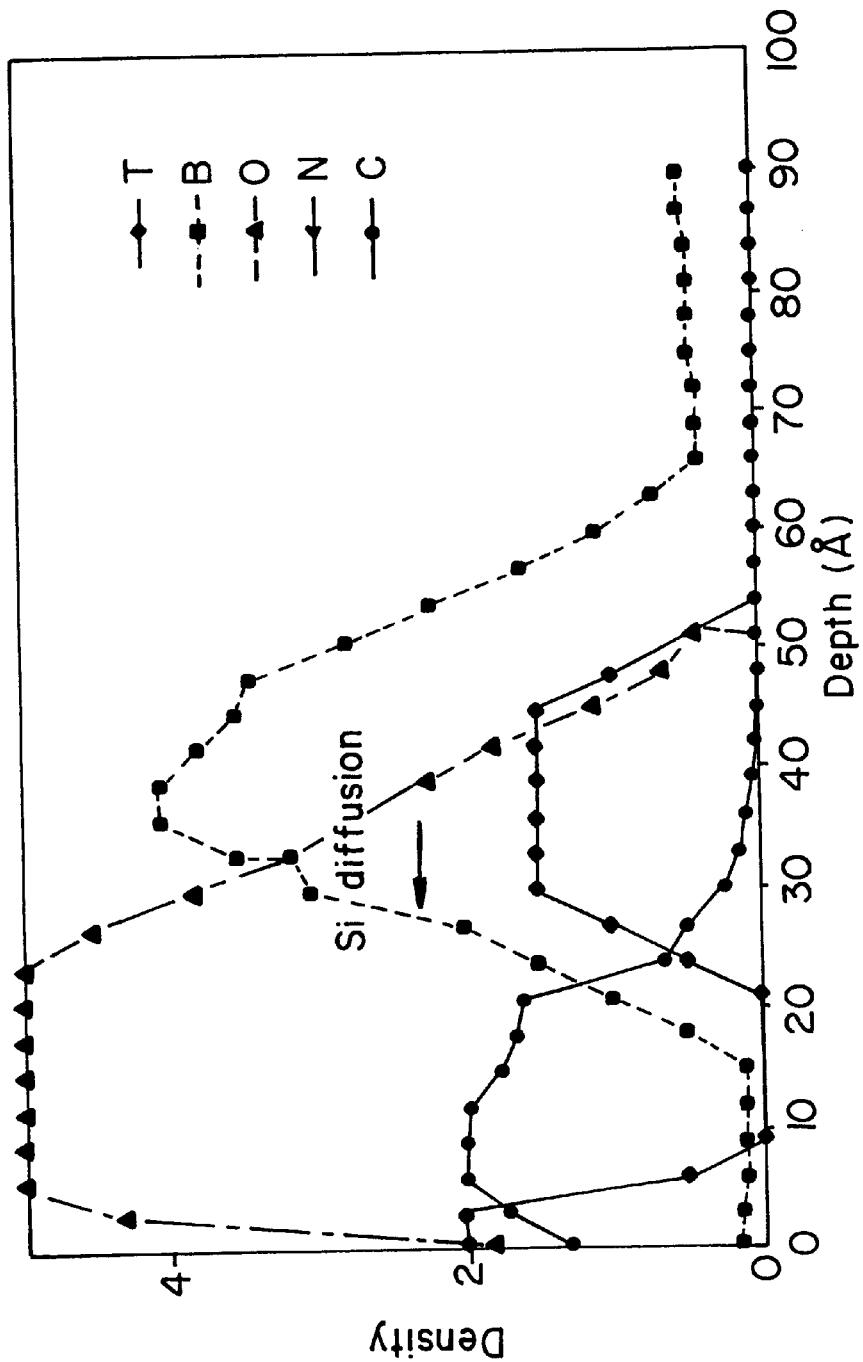
FIG. 6B shows MEIS post $N_2O$ anneal.
Figure 7:
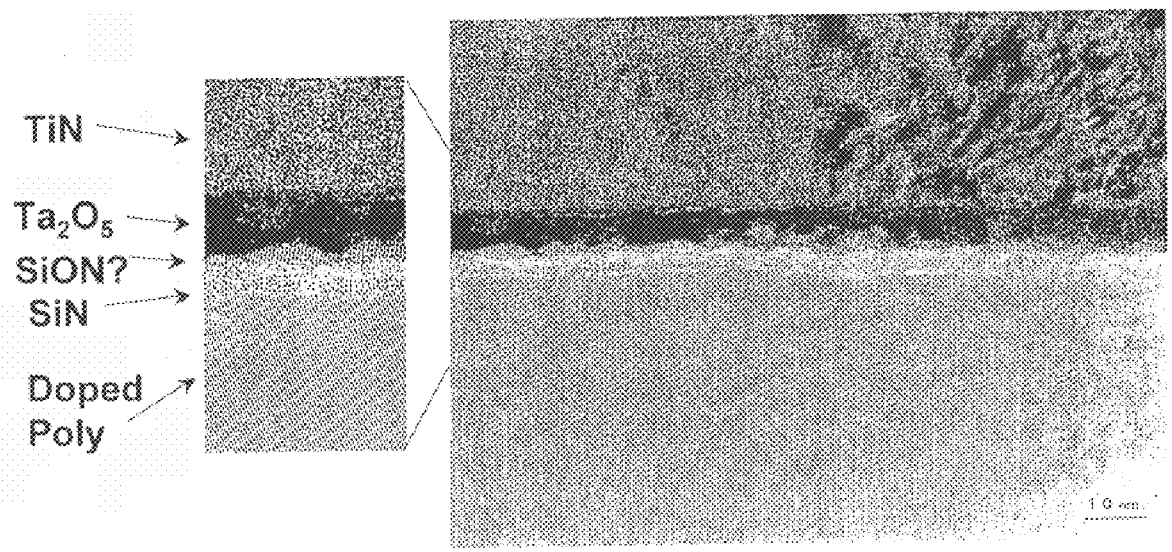
FIG. 7 is TEM data suggesting the existence of an additional layer between $Ta_2O_5$ and SiN.
Figure 8:
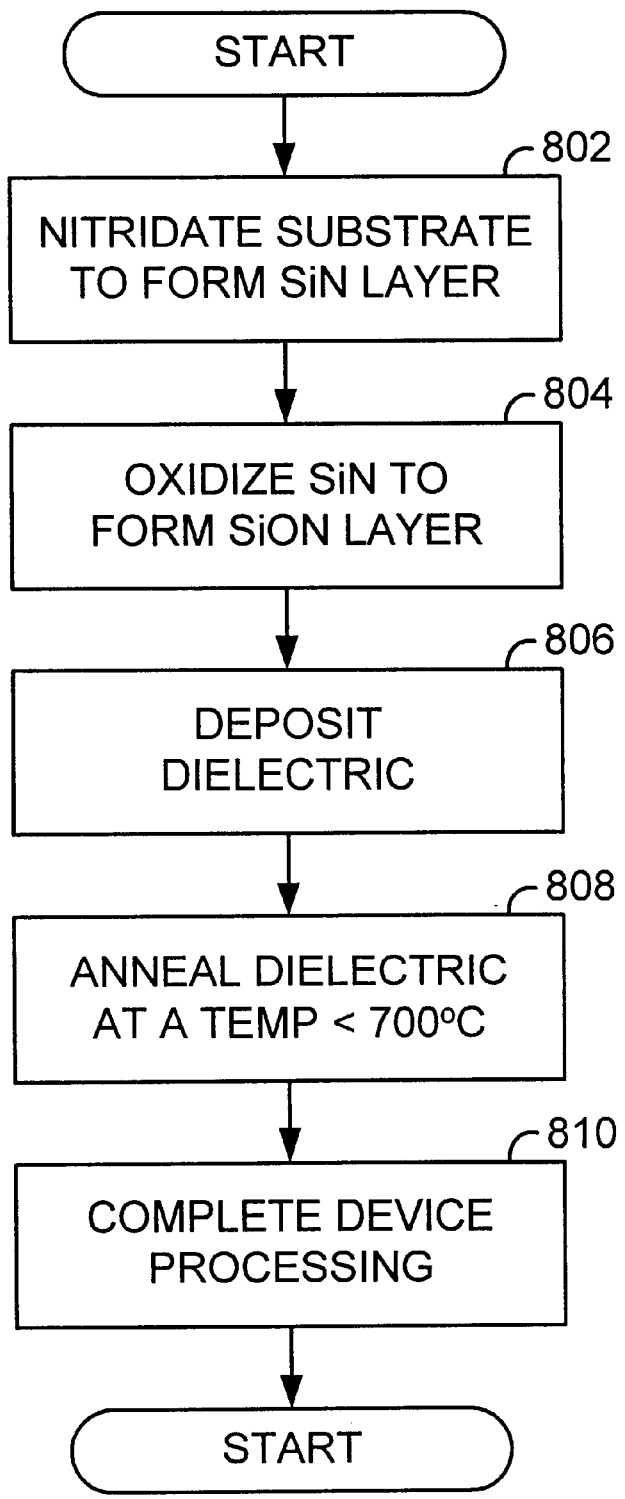
FIG. 8 is a flow chart which illustrates a process of forming a semiconductor device in accordance with the present invention.

FIG. 8 illustrates a flow chart which depicts a process of fabricating a semiconductor device in accordance with one of the embodiments of the present invention. The first step, as set forth in block 802, is to nitridate the substrate to form a thin silicon nitride barrier layer on the bottom electrode. The purpose of the silicon nitride barrier layer is to form an oxidation prevention barrier layer for the bottom electrode. In this way, oxygen cannot penetrate the grain boundaries of the polysilicon electrode and form oxides therein which can lead to a decrease in the effective dielectric constant of the capacitor dielectric and to an increase in electrode resistance. An example of the substrate is doped polysilicon, such as hemispherical grain polysilicon (HSG).

The silicon nitride layer can be formed by any method acceptable to one having ordinary skill in this art. For example, silicon nitride film can be formed by thermal nitridation by placing the substrate into a low pressure chemical vapor deposition (LPCVD) furnace; heating the substrate to a temperature between 800–950° C.; and exposing the substrate to ammonia gas ($NH_3$). Ammonia (NH3) gas then reacts with exposed silicon surfaces such as polysilicon electrode to form a silicon nitride ($Si_3N_4$) film. Alternatively, silicon nitride film can be formed by exposing the substrate to highly reactive nitrogen atoms formed by disassociating $NH_3$ or $N_2$ gas with microwaves in a cavity or chamber which is remote from the chamber in which the substrate is located. In another alternative, silicon nitride film can be formed by utilizing forming gas anneal at a relatively low nitridation temperatures (<950° C.).

Next, as set forth in block 804 of FIG. 8, is to oxidize the silicon nitride film to form a thin silicon oxynitride (SiON) layer. Ideally, the oxidation conditions would be optimized so that the SiN layer is eliminated completely. Specifically, the conditions are: for rapid thermal process using oxygen ($O_2$) or nitrous oxide ($N_2O$), the temperature is set at from about 700° C. to about 750°, the chamber pressure less than 2 Torr, and the gas flow rate at 1 slm. For remote plasma oxidation (RPO), the temperature is set at from about 600° C. to about 700° C. and the chamber pressure is 2 Torr or less. The gas mixture used is $O_2$ with $N_2$, $O_2$ with Helium, or $O_2$ with Argon. Gas flows at 1 slm.

The third step, as set forth in block 806 of FIG. 8, is to deposit a dielectric film over the SiON film. The dielectric film is a transition metal-oxide dielectric film such as, but not limited to, tantalum pentaoxide ($Ta_2O_5$) and titanium oxide ($TiO_2$). To blanket deposit a tantalum pentaoxide dielectric film by thermal chemical vapor deposition (CVD), a deposition gas mix comprising a source of tantalum, such as but not limited to, TAETO $Ta(OC_2H_5)_5$, TAT-DMAE $Ta(OC_2H_5)_4(OCHCH_2N(CH_3)_2$ or Ta-containing metal organic compounds which contain no oxygen (e.g. TBT-DET or EIT-DET), and a source of oxygen such as $O_2$ or $N_2O$ can be fed into a deposition chamber while the substrate is heated to a deposition temperature of between about 300 to about 500° C. and the chamber maintained at a deposition pressure of between about 0.5 to about 10 Torr. The flow of deposition gas over the heated substrate results in thermal decomposition of the metal organic Ta-containing precursor and a subsequent deposition of a tantalum pentaoxide film.

For example, TAETO or TAT-DMAE is fed into the chamber at a rate of between 10–50 milligrams per minute while $O_2$ or $N_2O$ is fed into the chamber at a rate of 0.3–1.0 SLM. TAETO and TAT-DMAE can be provided by direct liquid injection or vaporized with a bubbler prior to entering the deposition chamber. A carrier gas, such as $N_2$, $H_2$ and He, at a rate of between 0.5–2.0 SLM can be used to transport the vaporized TAETO or TAT-DMAE liquid into the deposition chamber. Deposition is continued until a dielectric film of a desired thickness is formed. A tantalum pentaoxide dielectric film having a thickness between 50–200 Å provides a suitable capacitor dielectric.

Next, as set forth in block 808 of FIG. 8, the dielectric film can be annealed, if desired, to form an annealed dielectric layer. Using state-of-art techniques, the dielectric layer is annealed in a suitable annealing process such as a rapid thermal anneal or a furnace anneal in an ambient comprising an oxygen containing gas, such as $O_2$ or $N_2O$ at a temperature between 800–850° C. Alternatively, a dielectric film can be annealed with highly reactive oxygen atoms generated by disassociating an oxygen containing gas, such as $O_2$, with microwaves in a chamber which is remote or separate from the chamber in which substrate is placed during the anneal. An anneal with reactive oxygen atoms which has been remotely generated is ideally suited for annealing a transition metal oxide dielectric film such as a tantalum pentaoxide dielectric. Specifically provided herein is a low annealing temperature, i.e., lower than 700° C., which generates capacitors with both high capacitance and low leakage current.

The next step of a process of the present invention, as set forth in block 810 of FIG. 8, is to complete the processing of the semiconductor device. For example, a top capacitor electrode can be formed over annealed dielectric layer by using any well known technology including blanket depositing a polysilicon film or metal film, such as TiN, over an annealed dielectric film and then using well known photolithography and etching techniques to pattern the electrode film and dielectric layer.

In another aspect, there is provided a method of integrating tantalum pentaoxide into an MIS stack capacitor for a semiconductor device by forming a thin barrier layer at the silicon/tantalum pentaoxide interface in the MIS stack capacitor and depositing tantalum pentaoxide above the barrier layer with a Ta-containing precursor. An example of the barrier layer is a SiON layer, formed, for example, by the steps of: performing oxidation in a rapid thermal processor at a temperature of lower than 700° C. to obtain a uniform $SiO_2$ film; and doping the $SiO_2$ film with N-containing gas mixtures at a temperature of not higher than 700° C. to form a SiON film, wherein the $SiO_2$ film is eliminated.

Rapid thermal $O_2$, rapid thermal $N_2O$, remote plasma oxidation (RPO) or in situ steam generation (ISSG) is used for the oxidation. The resulting $SiO_2$ film is thinner than 10 angstroms. For nitridation, the $SiO_2$ film is doped with N-containing gas mixtures in a remote plasma hardware for about 3 minutes at a temperature of from about 650° C. to about 700° C.; or for about 5 minutes at a temperature of about 650° C. or lower. The resulting SiON film is thinner than 10 angstroms (Å). Representative examples of N-containing gas mixtures include $N_2$, $N_2$+Argon, $N_2$+Helium, $NH_3$, $NH_3$+Argon, and $NH_3$+Helium.

Alternatively, to integrate tantalum pentaoxide into an MIS stack capacitor for a semiconductor device, the SiON barrier layer may be formed by the steps of forming a silicon nitride (SiN) film on a silicon surface of a substrate; and treating the SiN film with rapid thermal oxidation to form a SiON film, wherein the SiN film is eliminated.

Different precursors were used for depositing tantalum pentaoxide in constructing tantalum pentaoxide MIS capacitor. Table 1 shows the effect of Ta precursor on electrical performance of a $Ta_2O_5$ MIS capacitor. The integration sequence used initially was rapid thermal annealing using $NH_3$ at 950° C. to form a layer of silicon nitride of 20 Å thickness, followed by remote plasma oxidation (RPO) to form $Ta_2O_5$ layer of 100 Å thickness. The data shows that films grown with TAETO has ~20% better capacitance (Cp) than those grown using TAT-DMAE if subjected to single step oxidation anneal. TAT-DMAE, however, has a higher vapor pressure and hence is a better precursor for production worthiness.

Figure 9:
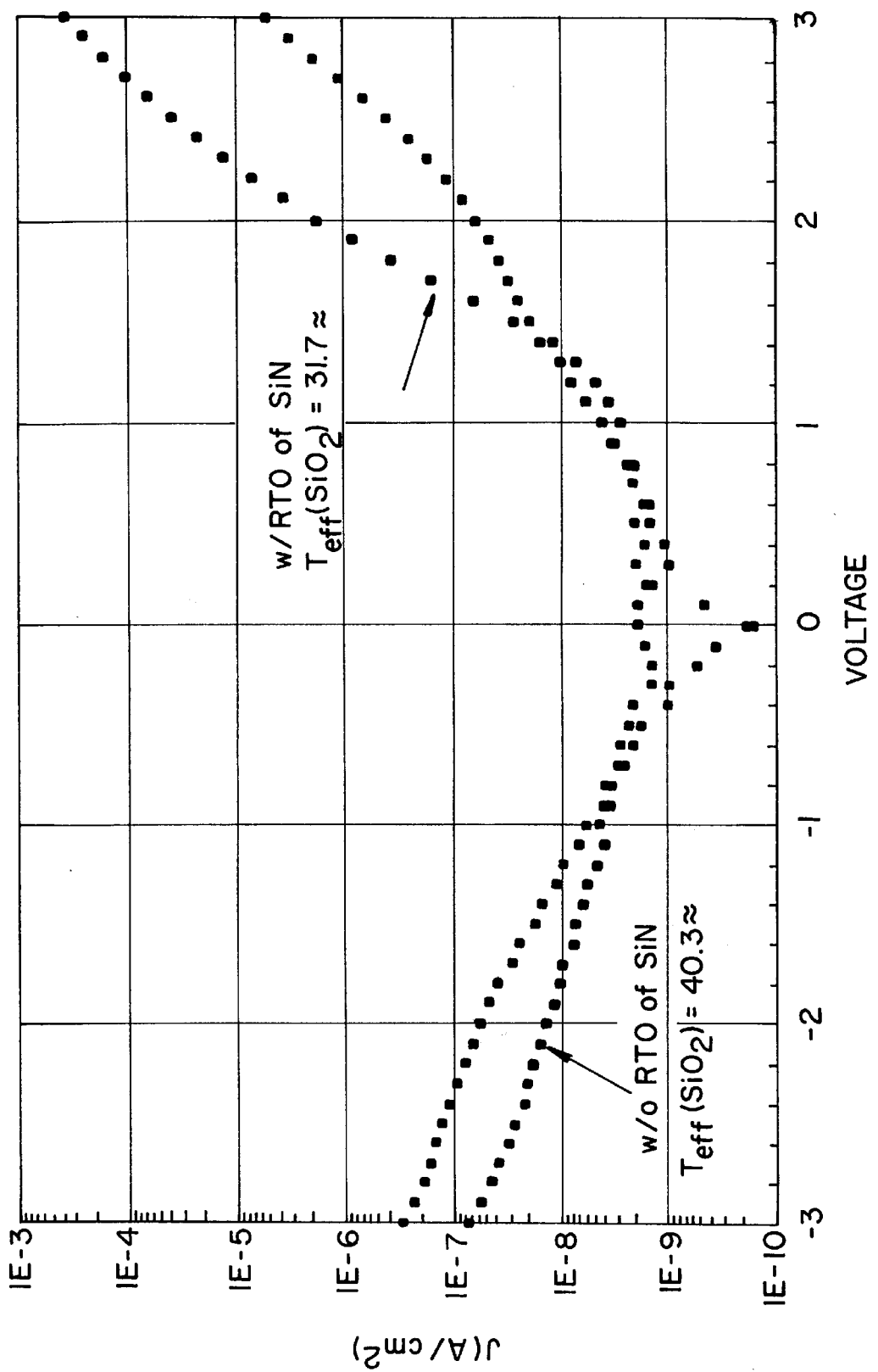
FIG. 9 shows that treating the SiN with rapid thermal oxidation (RTO) prior to $Ta_2O_5$ deposition decreases the interfacial capacitance hence decreasing the $T_{eff}$ for the capacitor stack. By doing so, the electrical performance of $Ta_2O_5$ stack capacitor is improved.

As shown in FIG. 9, for films grown with TAT-DMAE, treating SiN with rapid thermal oxidation (RTO) prior to TaO deposition decreases the interfacial capacitance hence decreasing the $T_{eff}$ for the stack capacitor. As a result, the $Ta_2O_5$ MIS capacitor has an improved electrical performance. Therefore, proper sequencing of the deposition process can lead to similar results with either precursor. Therefore, provided herein is a method of forming an MIS stack capacitor, comprising the steps of: forming a silicon nitride film on a silicon surface of a substrate; treating the silicon nitride film with rapid thermal oxidation to form a silicon oxynitride film, wherein the silicon nitride film is eliminated; and depositing tantalum pentaoxide above the silicon oxynitride film with a Ta-containing precursor, such as TAT-DMAE, TAETO or Ta-containing metal organic compounds which contain no oxygen (e.g. TBT-DET or EIT-DET). The rapid thermal oxidation is rapid thermal $O_2$, rapid thermal $N_2O$, or remote plasma oxidation (RPO).

TABLE 1

Effect of Ta precursor on electrical performance of $Ta_2O_5$ MIS capacitor.

| | | TaO (Target 100Å) | | | | |
|---|---|---|---|---|---|---|
| PRO | | TAETO | | | TAT-DMAE | |
| Temp/Time | Crystallization | Cp (fF/$\mu m^2$) | J at 1.5 V | $T_{eff}$ | Cp (fF/$\mu m^2$) | J at 1.5 V | $T_{eff}$ |
| 400° C.; 2 min | No | 9.58 | 4.10E−09 | 36 | 7.79 | 5.80E−09 | 44 |
| 500° C.; 2 min | No | 9.63 | 1.20E−09 | 36 | 7.85 | 1.40E−09 | 44 |
| 600° C.; 2 min | No | 9.58 | 6.00E−09 | 36 | 7.82 | 5.00E−09 | 44.2 |

The methods of using a SiON barrier layer grown at a temperature of lower than 700° C. for reducing the thermal budget of the capacitors are more applicable when the capacitors are used as embedded DRAM devices rather than stand alone commodity DRAM. The embedded DRAM (e-DRAM) is used in play stations, web TVs, etc. The technique of remote plasma nitridation (RPN) is currently being used to dope the gate oxide surface with nitrogen to prevent B diffusion.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of forming a dielectric for an MIS capacitor, comprising the step of:
    forming a silicon oxynitride layer at the interface of a silicon surface of a substrate and a dielectric film, thereby forming an MIS capacitor, said silicon oxynitride layer is formed by the steps of forming a silicon nitride film on a silicon surface of said substrate, and treating said silicon nitride film with rapid thermal oxidation to form a silicon oxynitride film prior to formation of the dielectric film.

2. The method of claim 1, wherein said rapid thermal oxidation is rapid thermal process using oxygen, rapid thermal process using nitrous oxide, or remote plasma oxidation (RPO).

3. The method of claim 2, wherein said rapid thermal oxidation is performed at a temperature of not greater than 750° C., with a gas flow rate of 1 slm and at chamber pressure of not more than 2 Torr.

4. The method of claim 2, wherein said remote plasma oxidation is performed at a temperature of lower than 700° C. and uses gas mixture selected from the group consisting of $O_2$ with $N_2$, $O_2$ with Helium, or $O_2$ with Argon.

5. A method of integrating tantalum pentaoxide into an MIS stack capacitor for a semiconductor device, comprising the steps of:
    forming a thin silicon oxynitride barrier layer at the silicon/tantalum pentaoxide interface in said MIS stack capacitor, said silicon oxynitride layer formed by the steps of forming a silicon nitride film on a silicon surface of a substrate, and treating said silicon nitride film with rapid thermal oxidation to form a silicon oxynitride film; and
    depositing tantalum pentaoxide above said barrier layer with a Ta-containing precursor, thereby integrating tantalum pentaoxide into a MIS stack capacitor.

6. The method of claim 5, wherein said rapid thermal oxidation is rapid thermal process using oxygen, rapid thermal process using nitrous oxide, or remote plasma oxidation (RPO).

7. The method of claim 6, wherein said rapid thermal oxidation is performed at a temperature of not greater than 750° C., with a gas flow rate of 1 slm and at chamber pressure of not more than 2 Torr.

8. A method of forming an MIS stack capacitor, comprising the steps of:
    forming a silicon nitride film on a silicon surface of a substrate;
    treating said silicon nitride film with rapid thermal oxidation to form a silicon oxynitride film, wherein said silicon nitride film is eliminated; and
    depositing tantalum pentaoxide above said silicon oxynitride film with a Ta-containing precursor, thereby forming an MIS stack capacitor.

9. The method of claim 8, wherein said rapid thermal oxidation is rapid thermal process using oxygen, rapid thermal process using nitrous oxide, or remote plasma oxidation (RPO).

10. The method of claim 9, wherein said rapid thermal oxidation is performed at a temperature of not greater than 750° C., with a gas flow rate of 1 slm and at chamber pressure of not more than 2 Torr.

11. The method of claim 9, wherein said remote plasma oxidation is performed at a temperature of lower than 700° C. and uses gas mixture selected from the group consisting of $O_2$ with $N_2$, $O_2$ with Helium, or $O_2$ with Argon.

12. The method of claim 8, wherein said Ta-containing precursor is selected from the group consisting of TAT-DMAE, TAETO, and Ta-containing metal organic compounds which contain no oxygen.

13. The method of claim 12, wherein said Ta-containing metal organic compound is selected from the group consisting of TBT-DET and EIT-DET.

* * * * *